United States Patent [19]

Ho et al.

[11] 4,252,579
[45] Feb. 24, 1981

[54] METHOD FOR MAKING SINGLE ELECTRODE U-MOSFET RANDOM ACCESS MEMORY UTILIZING REACTIVE ION ETCHING AND POLYCRYSTALLINE DEPOSITION

[75] Inventors: Irving T. Ho; Jacob Riseman, both of Poughkeepsie, N.Y.

[73] Assignee: International Business Machines Corporation, Armonk, N.Y.

[21] Appl. No.: 36,722

[22] Filed: May 7, 1979

[51] Int. Cl.³ .............. H01L 21/20; H01L 21/302
[52] U.S. Cl. .............................. 148/174; 29/571; 29/580; 148/175; 156/643; 156/649; 156/653; 156/662; 357/23; 357/41; 357/45; 357/49; 357/50; 357/55; 357/56; 357/59
[58] Field of Search ............. 148/174, 175; 29/571, 29/580; 156/643, 653, 649, 662; 357/23, 41, 45, 49, 50, 55, 56, 59

[56] References Cited

U.S. PATENT DOCUMENTS

| | | | |
|---|---|---|---|
| 3,412,297 | 11/1968 | Amlinger | 357/23 |
| 3,938,241 | 2/1976 | George et al. | 29/571 |
| 3,975,221 | 8/1976 | Rodgers | 148/175 X |
| 4,003,126 | 1/1977 | Holmes et al. | 29/571 |
| 4,017,883 | 4/1977 | Ho et al. | 357/23 X |
| 4,037,306 | 7/1977 | Gutteridge et al. | 357/55 X |
| 4,044,452 | 8/1977 | Abbas et al. | 357/49 X |
| 4,070,690 | 1/1978 | Wickstrom | 357/55 X |
| 4,084,175 | 4/1978 | Ouyang | 357/55 |
| 4,104,086 | 8/1978 | Bondur et al. | 148/175 X |
| 4,105,475 | 8/1978 | Jenne | 148/175 |
| 4,116,720 | 9/1978 | Vinson | 357/23 X |
| 4,145,703 | 3/1979 | Blanchard et al. | 357/55 |

OTHER PUBLICATIONS

Rodgers, T. J., "VMOS Memory Technology" 1977, IEEE Int. Solid-State Circuits Conf., Digest of Tech. Papers, pp. 74, 75, 239.
Holmes, F. G., "VMOS-Bipolar Compatible-Integrated Circuits" IEEE Transactions on Electron Devices, Jun. 1977, pp. 771-773.

Primary Examiner—L. Dewayne Rutledge
Assistant Examiner—W. G. Saba
Attorney, Agent, or Firm—George O. Saile

[57] ABSTRACT

A method for making highly dense, dielectrically isolated, U-shaped MOSFET. In a preferred method a monocrystalline silicon P substrate with a N+ layer thereon, a P layer on the N+ layer and a N+ layer on the P layer is provided. A pattern of U-shaped openings is formed in the body through to the P substrate by the reactively ion etching technique. This pattern of openings is filled with an insulator material, such as silicon dioxide. A conductive layer of N+ doped polycrystalline silicon is deposited on the bare surface of this silicon body. Openings are formed in the polycrystalline silicon over the silicon dioxide filled openings. A silicon dioxide layer is then grown by, for example, thermal oxidation over the polycrystalline silicon layer. Reactively ion etching is used to produce substantially U-shaped openings through the layers over the P substrate and into the P substrate to substantially bisect the regions of monocrystalline silicon. This etching step forms two storage cells in the monocrystalline silicon areas and a bit line for each column of cells in the polycrystalline silicon layer. A silicon dioxide gate insulator is grown on the monocrystalline silicon surfaces of the U-shaped openings by thermal oxidation in a suitable ambient. Conductively doped polycrystalline silicon is deposited in the U-shaped openings over the silicon dioxide gate insulator layer until the openings are filled and cover the surface of the body. The conductively doped polycrystalline silicon on the surface of the body is etched in a suitable pattern to produce the word lines of the random access memory device.

12 Claims, 14 Drawing Figures

METHOD FOR MAKING SINGLE ELECTRODE U-MOSFET RANDOM ACCESS MEMORY UTILIZING REACTIVE ION ETCHING AND POLYCRYSTALLINE DEPOSITION

DESCRIPTION

1. Technical Field

This invention relates to MOSFET devices and more particularly to highly dense dielectrically isolated MOSFET's which can be used in random access memory device structures.

2. Background Art

I. T. Ho, et al, U.S. Pat. No. 4,017,883, describes a charge-coupled random access memory cell which is formed in a semiconductor body divided into three adjacent regions along the planar surface of the body. The first region has an impurity diffused therein and serves alternately as a source and a drain for charge carriers. The second or gate region has a threshold voltage determined by an impurity imparted thereto by either diffusion or ion implantation. The third or storage region has a lower threshold voltage than the gate region. A single unitary metal electrode extends in superimposed relation to the second and third regions.

A V groove MOS field effect transistor is described in the T. J. Rodgers, U.S. Pat. No. 3,975,221 wherein the transistor is provided with a surface diffused drain and a common substrate source. A heavily doped base layer and a lightly doped space charge region are provided between the drain and source regions. The gate is formed on the inclined surface of a V groove which penetrates into the transistor to the substrate exposing the base layer to the gate structure. The gate is formed in the V groove by a silicon dioxide insulative layer and a gate conductive layer. Appropriate leads contact the gate conductor and and the drain electrode.

Amlinger, U.S. Pat. No. 3,412,297, F. E. Holmes, et al, U.S. Pat. No. 4,003,126; P. H. Ouyang, U.S. Pat. No. 4,084,175; M. A. Vinson, U.S. Pat. No. 4,116,720; T. J. Rodgers, "VMOS Memory Technology", 1977 IEEE International Solid-State Circuits Conference, Digest of Technical Papers pages 74, 75 and 239; and F. E. Holmes, "A VMOS-Bipolar Compatible Technology for High-Performance Analog Integrated Circuits"; IEEE Transactions on Electron Devices, June 1977, pages 771-773, describe variations of the VMOS field effect transistor structure and method for making such a structure.

The V groove is formed by anisotropic etching of silicon. The directional etching etches into the <100> planes of silicon at a much faster rate than into the <111> planes, resulting in the sharp, chiselshaped V groove geometry. The T. J. Rodgers article in the 1977 IEEE Solid State Circuits Conference describes a VMOS random access storage cell wherein the storage node of the VMOS cell is a N+ buried diffusion. In each cell as shown in FIG. 1 of the Rodgers publication, a V groove is etched on top of a buried N+ storage node. All four sides of the V groove will conduct during read or write operation. A very large ratio of channel width to channel length or a very small turn-on impedance of a VMOS device will result. In a random access memory device, the majority of the access time delay can be attributed to the peripheral circuity. The delay in the memory array depends heavily upon the charge transfer ratio. The VMOS cell requires a trade-off between charge stored and array density because any enlargement of the V groove substantially reduces the array density.

The J. A. Bondur, et al, U.S. Pat. No. 4,104,086 describes methods for forming U-shaped grooves in monocrystalline silicon by reactive ion etching. The shape of the grooves may be tailored to preferably have a slight taper of between about 2° to 20° from the vertical. The patent describes the filling of the groove with dielectric isolation material, such as silicon dioxide, for providing a pattern of dielectric isolation for a number of monocrystalline silicon regions.

SUMMARY OF THE PRESENT INVENTION

In accordance with the present invention, there is shown a highly dense matrix of MOSFET's which are dielectrically isolated from one another and which have a plurality of vertical or slightly slanted from the vertical U-shaped grooves. In this configuration, the inversion charge storage area is determined mainly by the depth of the groove. The density of such a U-shaped MOS single electrode random access would be substantially greater than a single electrode VMOS random access memory device structure.

In the disclosed vertical MOSFET single conducting sidewall random access memory, only one of the four sidewalls of the groove is conducting. This random access memory is about half a VMOS memory of the type shown in the Rodgers patent or publication with half the storage and half of the bit line diffusion areas. The density of the present improved structure will be roughly doubled that of the VMOS type device structure and the storage to bit line capacitance ratio remains about the same. Further, the thin silicon dioxide gate insulator area per bit of storage will have a four times reduction for better reliability.

The methods for producing a matrix of highly dense MOSFET devices which are dielectrically isolated from one another utilizes reactive ion etching techniques. The reactive ion etching technique has substantial advantage over the anisotropic etching which is utilized in the VMOS processes. In the VMOS process it is necessary to use greater areas to obtain more storage area. In order to get higher density, a very thin epitaxial layer will be required. This is so because the cell area is determined by the depth of the groove, and the depth of the groove is, in turn, determined by the thickness of the epitaxial layer. For instance, for micrometer epitaxial thickness, the projectional area of the groove will be at least 3×3 micrometers. This is because the V shape is depended upon the anisotropic etching of <100> silicon. The reactive ion etching process described is independent of the crystallographic orientation of the monocrystalline silicon being etched and the depth of the U-shaped groove may be whatever desired.

One method for producing the matrix of highly dense MOSFET devices involves providing a P− substrate having a P layer on the substrate, and a N+ layer on the P layer. Reactive ion etching of the U-shaped openings in the body through the layers and into the P substrate is effected where the dielectric isolation is required. The openings are completely filled with silicon dioxide or the like. Reactive ion etching of other areas is used to produce U-shaped openings through the layers and into the substrate. The U-shaped openings are formed in the monocrystalline silicon areas and are spaced from the dielectric isolation regions. The body is subject to an oxygen ambient to produce the desired gate dielectric layer on the surface of the openings. The remaining volume of each opening is filled with a metal or conductive polysilicon material wherein the silicon dioxide in the MOSFET area is the gate oxide, the metal or polycrystalline silicon filling the openings in the gate is the gate electrode, and the source and drain regions are defined in the N+ regions between the dielectric isolation region and the MOS gate regions.

An alternate method can be practiced which produces a MOSFET single sidewall random access memory device structure which features the U-shaped MOSFET type device. In this method a monocrystalline silicon P substrate is provided with a N+ layer thereon, a P layer on the N+ layer and a N+ layer on the P layer. A pattern of U-shaped openings is formed in the body through to the P substrate by the reactively ion etching technique. This pattern of openings is filled with an insulator material, such as silicon dioxide. A conductive layer of N+ doped polycrystalline silicon is deposited on the bare surface of this silicon body. Openings are formed in the polycrystalline silicon over the silicon dioxide filled openings. A silicon dioxide layer is then grown by, for example, thermal oxidation over the polycrystalline silicon layer. Reactively ion etching is used to produce substantially U-shaped openings through the layers over the P substrate and into the P substrate to substantially bisect the regions of monocrystalline silicon. A silicon dioxide gate insulator is grown on the monocrystalline silicon surfaces of the U-shaped openings by thermal oxidation in a suitable ambient. Conductively doped polycrystalline silicon is deposited in the U-shaped openings over the silicon dioxide gate insulator layer until the openings are filled and cover the surface of the body. The conductively doped polycrystalline silicon on the surface of the body is etched in a suitable pattern to produce the word lines of the random access memory device.

DISCLOSURE OF THE INVENTION

Figure 1:
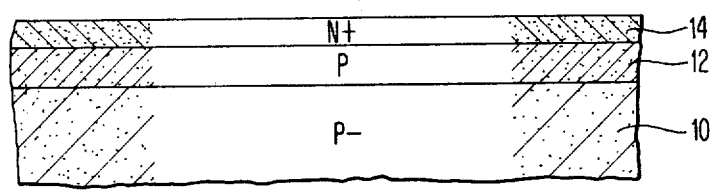
FIGS. 1 through 5 illustrate a first method for producing a matrix of highly dense MOSFET devices which are dielectrically isolated from one another.

Referring now more particularly to FIGS. 1-14, the manufacturing steps for making a matrix of highly dense MOSFET device structures are shown. The structure of FIG. 1 includes monocrystalline silicon substrate 10 which is shown as P− conductivity for illustration purposes, P layer 12 over the substrate 10 and a N+ layer 14 on the layer 12. For the purposes of the invention, either all or some of the layers 10, 12 and 14 could be of opposite conductivity from the conductivity types indicated. This structure can be fabricated by various techniques; however, the preferred technique is to provide a P− <100> crystallographic oriented monocrystalline silicon substrate having a dopant concentration of $1 \times 10^{14}$ to $1 \times 10^{15}$ atoms/cc and a conductivity of 100 ohms centimeter to 25 ohms centimeter. The P layer 12 is preferably grown onto the substrate 10 by means of epitaxial growth. This may be done by conventional techniques such as the use of $SiCl_4/H_2$ or $SiH_4/H_2$ mixtures at growth temperatures of about 1000° C. to 1200° C. The P layer may have a typical thickness of between about 0.5 to 5 microns and preferably 2 microns. The dopant concentration of layer 12 is preferably between $1 \times 10^{16}$ to $1 \times 10^{17}$ atoms/cc having a conductivity of 2 ohms centimeter to 0.2 ohms centimeter. The layer 14 may be formed by epitaxial growth techniques similar to that of the P layer 12 but with opposite conductivity dopant material. However, it is preferred that the N+ layer 14 be formed by a blanket diffusion or ion implantation into the P epitaxial layer that was grown in the previous step.

Figure 2:
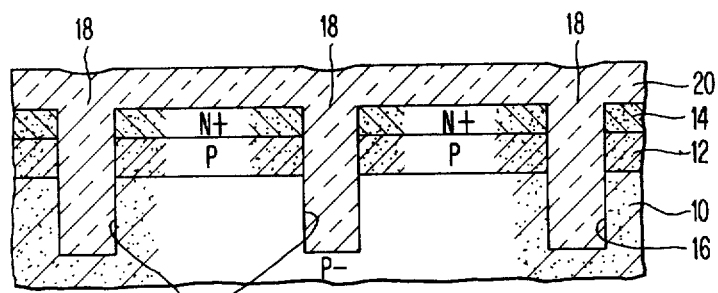

The FIG. 1 structure is now ready for reactive ion etching process. This process may be more fully understood by reference to the J. M. Harvilchuck, et al patent application (Docket No. FI9-75-007) Ser. No. 960,322, filed Nov. 13, 1978, and the Bondur, et al, U.S. Pat. No. 4,104,086. Briefly the process involves formation of a masking layer (not shown) which may be composed of silicon dioxide or a combination of masking layers which include silicon dioxide or silicon nitride which are deposited by conventional techniques onto the surface of layer 14. Openings are formed in the masking layer in the regions where the U-shaped openings are desired. A RF induced plasma which is made reactive by containing for example, a chlorine specie as specified in the Harvilchuck patent application and Bondur patent. The preceise description of the RF glow discharge apparatus is given in the before mentioned patent application. The reactive ion etch or plasma ambient is preferably a combination of an inert gas, such as argon, and a chlorine specie. Application of suitable power in the order of about 0.1 to 0.75 watts/cm² from a RF voltage source will produce sufficient power density to cause the reactive ion etching operation of silicon to be carried out at a rate of about 0.02 to 0.08 micrometers per minute. The desired result of the etching is shown in FIG. 2 wherein substantially U-shaped openings or channels are at least partially penetrating the P− conductivity region 10 is shown. It is important that the openings or channels be tapered at greater than about 2 to 20 degrees from the vertical as described in the Bondur, et al U.S. Pat. No. 4,104,086. This is because the subsequent filling deposition results in a slightly thicker deposition near the top of the groove as opposed to the bottom of the groove.

The next step in the process is to fill the openings 16 with dielectric material 18. This process of filling may be simply by thermally oxidizing the openings by subjecting the body to an oxidation ambient which may be, for example, 970° C. in wet oxygen. In such an ambient for 17 hours an opening of 2 microns in width may be closed. Alternatively, chemical deposition may be utilized to fill the openings with dielectric material composed of silicon dioxide, silicon nitride, aluminum oxide or combinations thereof. This process is typically a chemical vapor deposition of a gas mixture of $N_2O$, $SiH_4$ and $N_2$ at the growth temperatures of about 800° C. for forming silicon dioxide. It is sometimes preferred to use a combination of the thermal grown dielectric and the chemical vapor deposition dielectric, because the thermal silicon dioxide layer provides a superior dielectric quality to that of the chemical vapor deposited silicon dioxide at the surface of the silicon. During the process of either thermal deposition or chemical vapor deposition, a surface layer 20 of the dielectric is also formed.

Figure 3:
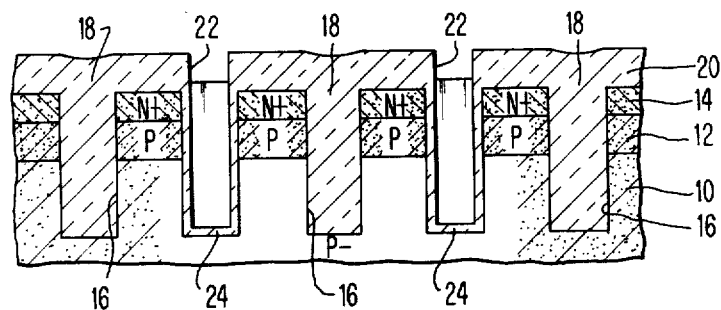

Next, as shown in FIG. 3, a second reactive ion etched deep opening or trench 22 is formed through the dielectric layer 20, the layers 14, 12 and into the substrate 10. The process for forming the reactive ion etched opening 22 is as taught in the before mentioned Harvilchuck, et al patent application and Bondur, et al patent. The preferred chlorine specie etch for silicon etches through the silicon dioxide layer 20 in a slower manner than through monocrystalline silicon. If desired, a photoresist mask (not shown) and chemical etch can be used to etch through the silicon dioxide layer 20 followed by reactive ion etching of the silicon through the silicon dioxide layer 20 used as the mask. The formed opening is substantially U-shaped with a slight taper from the vertical of preferably 2° to 10° from the vertical. The monocrystalline regions between the dielectric isolation areas 18 are substantially bisected by the U-shaped openings 22. The body is subjected to an oxidizing ambient which may be 970° C. in oxygen and/or steam to produce the gate dielectric 24 in the openings. The thermal oxidation technique is very accurate in producing the desired gate dielectric thickness for the MOSFET devices of the resulting product. The surface layer 22 will also be slightly thickened by the oxidation process.

Figure 4:
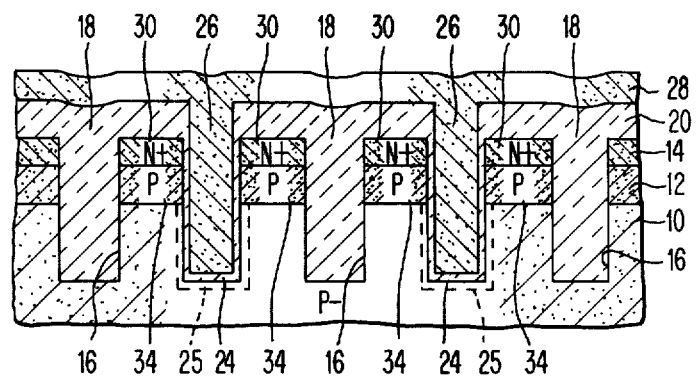

FIG. 4 shows the resulting structure of the present process. To produce the FIG. 4 structure it is necessary to deposit doped polysilicon layer 26 into the openings 22 which are coated with gate dielectric silicon dioxide layer 24. The doped polysilicon is typically deposited by a chemical vapor deposition using $SiH_4$, $N_2$ and a dopant material such as $PH_3$. The chemical vapor deposition may alternatively use a reactive plasma in its deposition wherein a lower temperature is possible during the process. The dopant is preferably N+, and the doped polycrystalline silicon covers the entire surface of the body. The photolithography techniques are utilized to delineate the desired pattern of word lines on the surface layer 28 of polycrystalline silicon. The word lines appropriately connect the various MOSFET devices in a random access memory integrated circuit. The N+ regions 30 may act as bit lines for a random access memory cell. The channel for the FET is P region 34. The doped polycrystalline filled opening 26 is the gate electrode. The capacitor of this one device MOSFET random access memory cell is the depletion region 25 formed in the P− substrate surrounding the gate dielectric layer 24 and electrode 26.

Figure 5:
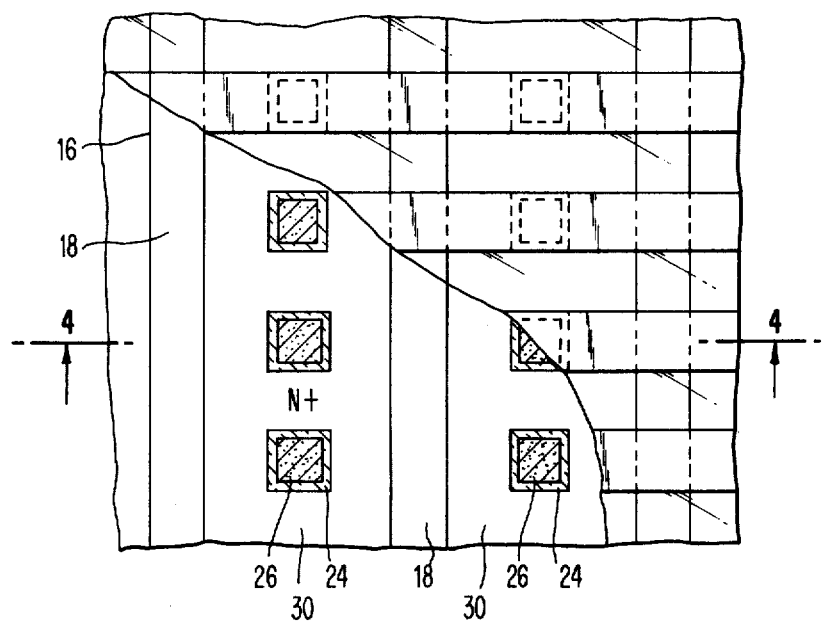

FIG. 5 illustrates the plane view of the surface of the FIG. 4 cross-section. FIG. 4 is taken at the cross-section 4—4 of FIG. 5.

Figure 6:
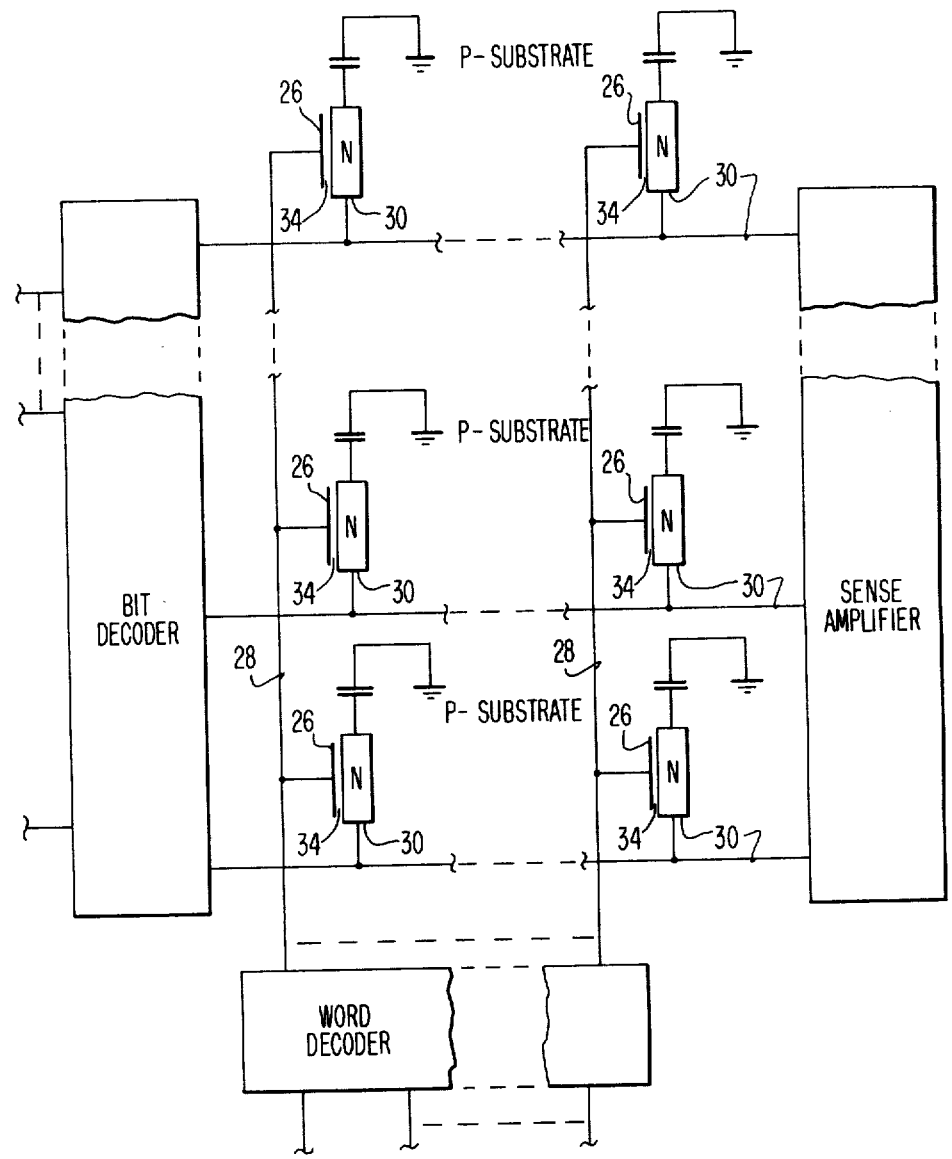
FIG. 6 illustrates the electrical circuit of the FIGS. 4, 5 device structure.

The operation of the FIG. 4, 5 device structure may be better understood with reference to FIGS. 4, 5 and 6. During write operation, a positive voltage is applied to the word line 28. The channel 34 turns conducting. Writing a "1" or a "0" is determined by the bit line voltage at a high or a low level, respectively. These levels control whether or not there are electrical charges stored in the potential well 25 which is formed in the P− substrate next to the thin gate oxide 24, as in the operating of a charge couple device (CCD).

At the end of a write operation, the word line voltage drops to its quiescent level and turns off the channel before the bit line returns to its quiescent state. The quiescent voltage of the word line should be sufficiently high to maintain the potential wells of these memory cells.

During "read" operation, the word line voltage will drop, typically, to zero volts. The surface potential will drop and the charges originally stored in the potential wells will be pushed out toward the bit lines and be sensed. The bit line is maintained as a positive voltage. A. F. Tasch "The Charge-Coupled RAM Cell Concept", IEEE Journal of Solid State Circuits, Vol. SC-11, No. 1, pp. 58–63, Feb. 1976, gives further details of the memory cell operation described above.

When the charges from a specific potential well are being pushed out during the "read" operation, it is important that all of them will go to the respective bit line without leaking into any adjacent potential wells to cause some noise coupling problem. Adjacent potential wells attached to different bit lines are isolated by oxide trenches 16, therefore, the noise coupling problem is easily avoided. It is also possible to furnish a two dimensional oxide isolation (not shown in FIG. 4) to avoid noise coupling on the same bit line, should it be required.

A second embodiment is illustrated in FIGS. 7 through 14. This is the preferred embodiment since it results in a MOSFET random access memory structure having single channel sidewall FET devices. The size of this random access memory is about one-half the size of the prior art VMOSFET random access memory integrated circuits. Further, the storage to bit line capacitance ratio remains about the same despite this reduction in size.

Figure 7:
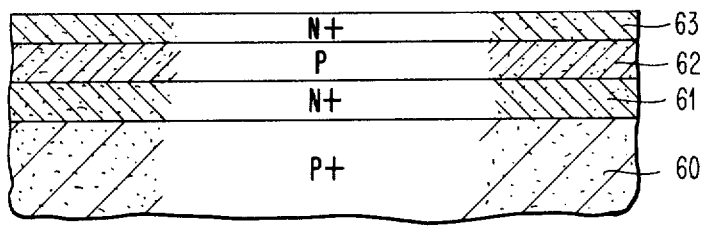
FIGS. 7 through 13 illustrate a second method embodiment for forming a random access memory integrated circuit device utilizing MOSFET devices.
Figure 8:
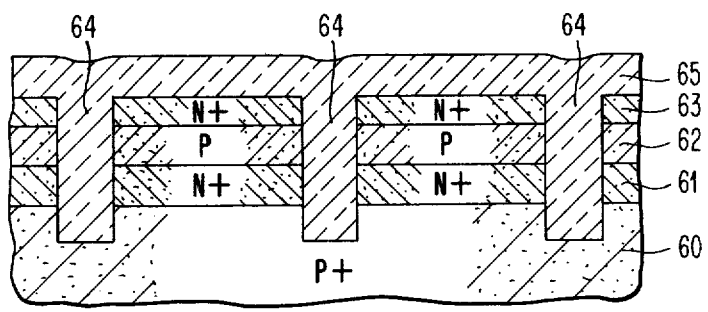
Figure 9:
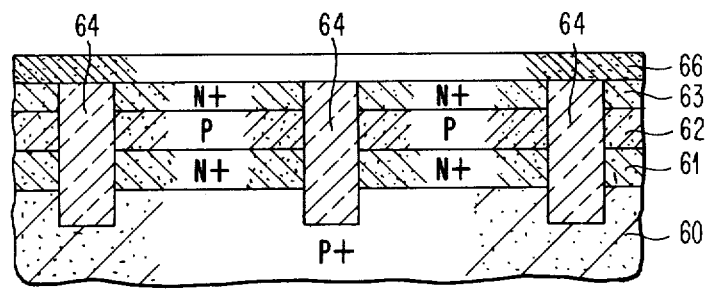

Referring now more particularly to FIG. 7, there is shown the structure of the process after a series of epitaxial and/or diffusion steps. The structure includes a monocrystalline silicon substrate 60 which may be of any suitable crystallographic orientation, a N+ layer 61 thereover, a P layer 62 over the N+ layer, and a second N+ layer 63 over the P layer. The P+ substrate may have a conductivity of $1 \times 10^{18}$ atoms/cc or higher. The layers 61, 62 and 63 may be formed by conventional eqitaxial growth as described in the discussion above in the FIGS. 1 through 5 embodiment. Alternatively, the series of layers may be formed by combinations of epitaxial growth and/or blanket diffusion steps. The preferred conductivity of the layer 61 is the $10^{20}$ atoms/cc, the P layer 62 is $1 \times 10^{16}$ to $1 \times 10^{17}$ atoms/cc, and the N+ layer 63 is $10^{20}$ atoms/cc.

A pattern of U-shaped openings is formed in the body using reactively ion etching methods as described in regard to the first embodiment through a suitable pattern of a masking layer into the P+ substrate 60. The result of the process is a pattern of openings which isolate regions of the monocrystalline silicon substrate and layers thereover. This pattern of openings is then filled with dielectric material such as silicon dioxide, silicon nitride, aluminum trioxide and combinations thereof. The filled openings are given as dielectric isolation regions 64. During the filling of the openings the dielectric material is also deposited over the surface of the body as layer 65. This layer 65 is reactive ion etched completely from the surface of the N+ layer 63. The result of this reactive ion etching is the exposure of the N+ islands and the top of the silicon dioxide dielectric layer filled region 64. A layer 66 of highly doped N+ polycrystalline silicon is formed over the entire surface which results in the FIG. 9 structure.

Figure 10:
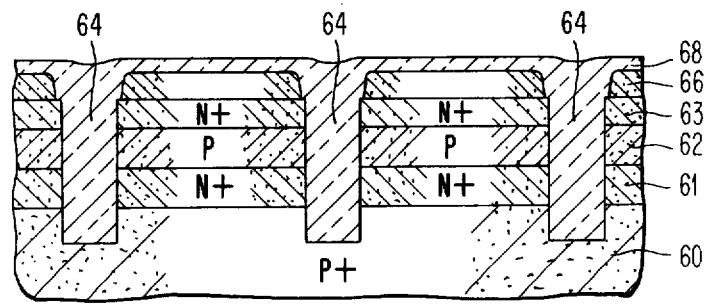

Photolithography techniques are utilized to form openings in the polycrystalline silicon layer 66 over the silicon dioxide filled openings 64. The body is then subjected to an oxidation ambient such as 970° C. in wet oxygen to produce a oxidized layer 68 over the N+ conductive polycrystalline layer 66. This resulting structure is shown in FIG. 10.

Figure 11:
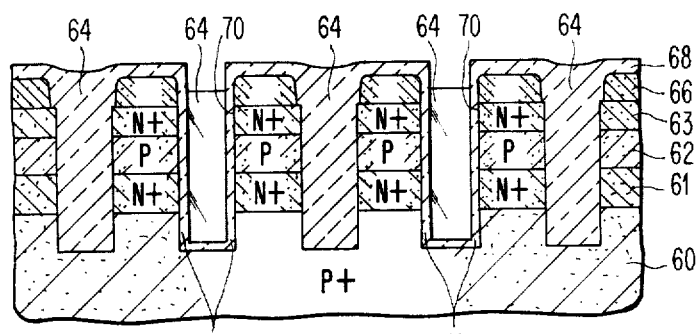

Next, as shown in FIG. 11, a second reactive ion etched deep opening or trench 20 is formed through the dielectric layer 68 and layers 66, 63, 62, and 61 and into the P+ substrate 60. The process for forming the reactive ion etched opening 70 is as taught in the before mentioned Harvilchuck, et al patent application and Bondur, et al patent, and as described in the first embodiment in connection with FIG. 3. The opening is substantially U-shaped with a slight taper from the vertical of preferably 2° to 10° from the vertical. The monocrystalline silicon regions between the dielectric isolation areas 64 are substantially bisected by the U-shaped openings 70. The openings 70, in fact, isolate the bisected regions of monocrystalline from one another since they run from one dielectric region to another dielectric region. This concept can be seen in FIG. 13 which will be described in connection with that figure. The gate silicon dioxide insulator 72 is formed by subjecting the body to an oxidizing ambient which may be, for example, 970° C. in oxygen or steam to produce the silicon dioxide layer 72. The thickness of this gate dielectric may be, for example, between about 400 to 1000 angstroms. The dimensions of the gate may be changed along with other critical device dimensions according to the MOSFET scaling rules described in the article "Design of Ion-Implanted MOSFET's With Very Small Physical Dimensions", by R. H. Dennard, et al, IEEE J. Solid-State Circuits Vol. SC-9, No. 5, pp. 256-68, Oct. 1974. The result of this process is the FIG. 11 structure.

Figure 12:
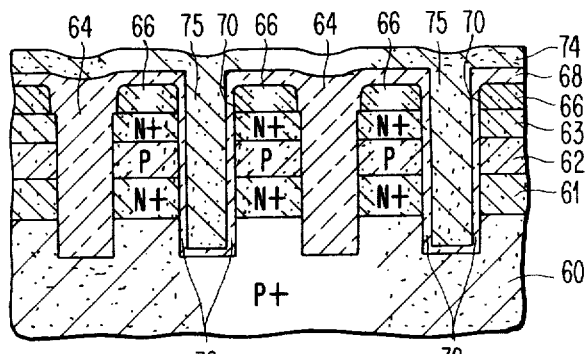
Figure 13:
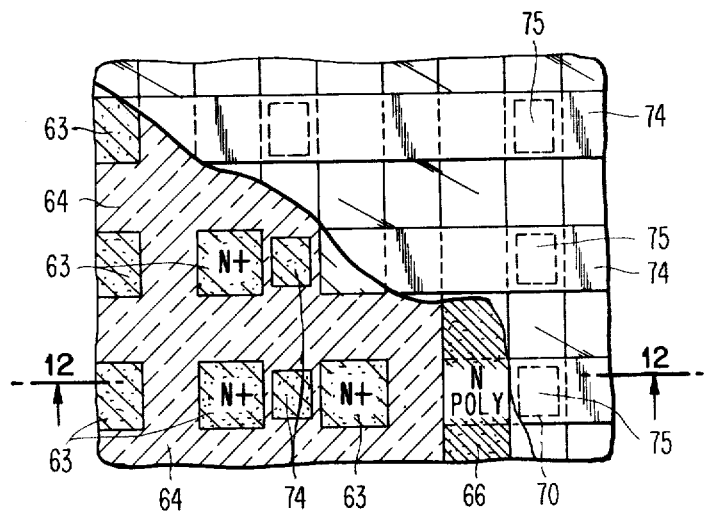

The final steps of the second process embodiment may be better understood with reference to FIGS. 12 and 13. Doped polycrystalline layer 74 typically deposited by a chemical vapor deposition as described in connection with FIG. 4 above is formed in the openings 70 which have the gate dielectric 72 therein and over the surface of the silicon dioxide layer 68. The doped polycrystalline silicon within the openings act as the gate electrode 75. The photolithography techniques are utilized to delineate the desired pattern of word lines in the surface layer 74 of the preferred N+ polycrystalline silicon. Passivation coatings may now be applied to the structure to prevent impurities from the ambient from reaching the integrated circuit. These coatings are applied by conventional techniques.

The FIG. 13 is a top view of the integrated circuit structure with the top layer partially removed. FIG. 12 is taken along the cross section of 12—12 of FIG. 13. The N+ polycrystalline silicon layer 66 is the bit line of the memory. The N+ layers 61 and 63 are the source/drain regions of the MOSFET. The P layer 62 separates the N+ layers 61 and 63 and provides the region for the location of the MOSFET channel. The junction between the P+ substrate 60 and the N+ layer 61 is the capacitor of the memory cell.

Figure 14:
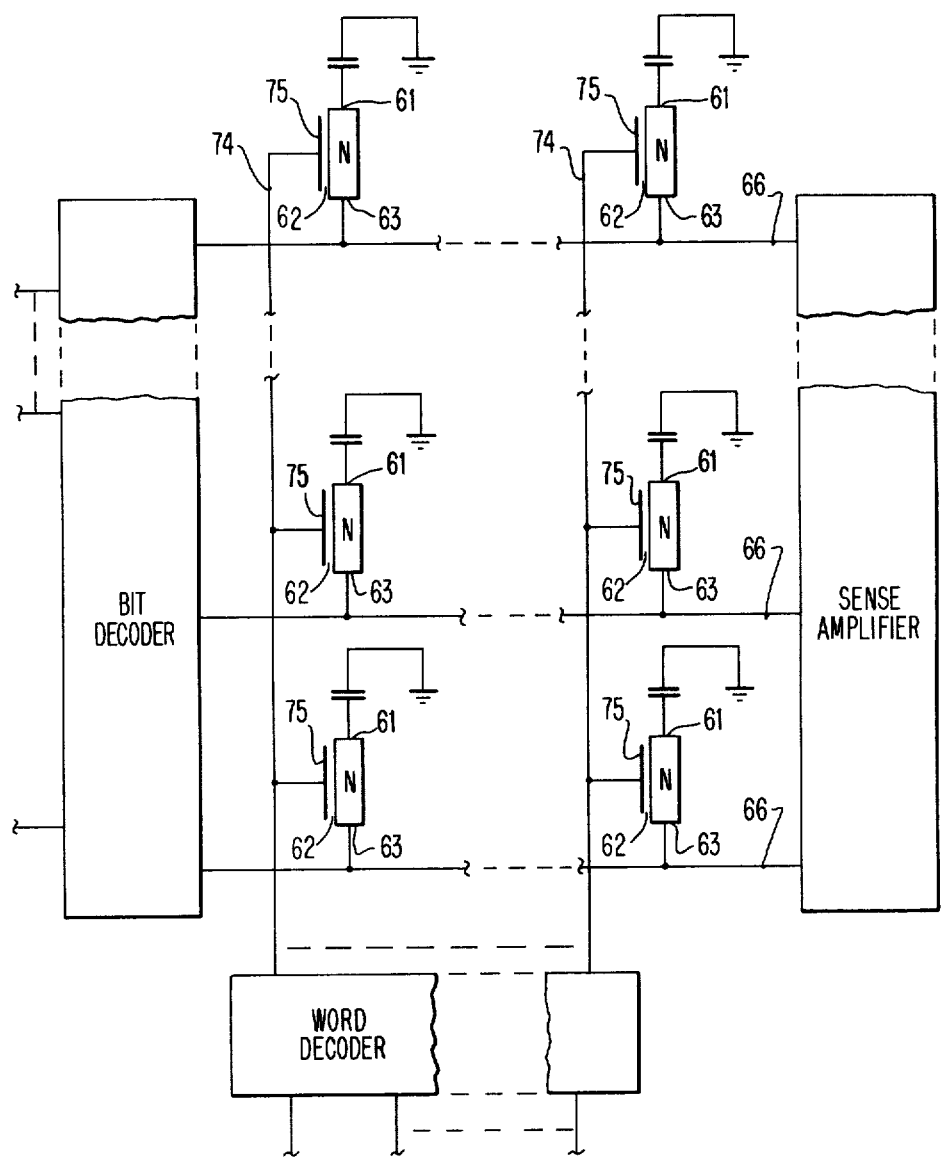
FIG. 14 illustrates the electrical circuit of the FIGS. 12, 13 device structure.

FIG. 14 illustrates the electrical circuit of the FIG. 12, FIG. 13 embodiment. The like numbers in the FIGS. 12, 13 and 14 show like elements. The bit lines 66 are shown in the FIG. 14 to connect to sense amplifier of the memory cell, and the word lines 74 connect to the word driver circuits. The memory cell circuit is basically a one device dynamic memory cell such as described in the Dennard U.S. Pat. No. 3,387,286 which is assigned to the same assignee as is the present invention.

The operation of the FIGS. 12, 13 device may be understood with reference to FIG. 14. The operation of these memory cells is quite similar to the operation shown in the referred patent of Dennard's. During "write" operation, a positive voltage is applied to the word line 74, the channel 62 turns conducting. Writing a "1" or a "0" is determined by the bit line 66 voltage at a high or a low level respectively. These level controls whether or not there are electrical charges stored in the PN junction capacitor formed between the N+ node 61, and the P+ substrate layer storage capacitor results from using P+ substrate instead of the conventional P— substrate.

At the end of a "write" operation, the word line voltage drops to its quiescent level and turns off the channel before the bit line returns to its quiescent state.

During "read" operation, the word line voltage rises again to turn on the channel, the charges stored in the capacitor will flow back to the bit line and be sensed.

While the invention has been particularly shown and described with reference to the preferred embodiments thereof, it will be understood by those skilled in the art that the foregoing and other changes in form and details may be made therein without departing from the spirit and scope of the invention. For example, the N and P conductivity types may be interchanged, and many different types of memory circuits may be used other than that described in the embodiments.

Having thus described my invention, what I claim as new, and desire to secure by Letters Patent is:

1. Method for producing a matrix of highly dense vertical MOSFET devices which are dielectrically isolated from one another comprising:
   providing a P monocrystalline silicon substrate having a P layer thereon and a N+ layer;
   reactively ion etching a pattern of U-shaped openings in the body into the P substrate which isolates regions of said monocrystalline silicon substrate and layers thereover;
   filling said openings with silicon dioxide;
   reactive ion etching a substantially U-shaped opening through said layers over said P substrate and into said substrate to substantially bisect said regions of monocrystalline silicon;
   growing on the monocrystalline silicon surface of said U-shaped opening a gate silicon dioxide by thermal oxidation in a suitable ambient;
   depositing doped polycrystalline silicon into the said openings and over said silicon dioxide surface layer until said openings are filled; and
   etching said doped polycrystalline silicon to form the word line of said random access memory.

2. The method of claim 1 wherein said MOSFET devices are part of a random access memory wherein the N+ layer between said U-shaped silicon dioxide filled openings and said U-shaped polycrystalline silicon filled openings are bit lines of said memory and said P layer is the channel of said MOSFET devices.

3. The method of claim 1 wherein the said U-shaped openings are slightly wider at the surface than at the bottom of the opening.

4. The method of claim 1 wherein said P layer is formed on said P substrate by epitaxial growth and said N+ layer is formed by a blanket diffusion into a surface portion of said epitaxial P layer.

5. The method of claim 1 wherein said P layer is formed on said P substrate by epitaxial growth and said N+ layer is formed by epitaxial growth on the surface of said P layer.

6. The method for producing a MOSFET single sidewall random access memory device comprising:

providing a P monocrystalline silicon substrate having a N+ layer thereon, a P layer on the said N+ layer, and a N+ layer on the said P layer;

reactively ion etching a pattern of U-shaped openings in the body into the P substrate which isolates regions of said monocrystalline silicon substrate and layers thereover;

filling said openings with silicon dioxide;

reactively ion etching any material from the surface of said N+ layer on said P layer;

depositing a layer of N+ doped polycrystalline silicon on the surface of said N+ layer on said P layer and on said silicon dioxide filled openings;

forming openings in said polycrystalline silicon over said silicon dioxide filled openings;

growing a silicon dioxide layer over the surface of said polycrystalline silicon layer;

reactively ion etching a substantially U-shaped opening through said layers over said P substrate and into said substrate to substantially bisect said regions of monocrystalline silicon;

growing on the monocrystalline silicon surface of said U-shaped opening a gate silicon dioxide insulator by thermal oxidation in a suitable ambient;

depositing doped polycrystalline silicon into the said openings and over said silicon dioxide surface layers until said openings are filled; and etching said doped polycrystalline silicon to form the word line of said random access memory.

7. The method of claim 6 wherein said N+ polycrystalline silicon is the bit line of said memory, said N+ layers are source/drain regions of the said MOSFET, and P layer separates said N+ layers and provides the region for location of the MOSFET channel, and the junction between said P substrate and said N+ layer thereon is the capacitor of said memory.

8. The method of claim 6 wherein said N+ layers and said P layers are formed by epitaxial growth.

9. The method of claim 6 wherein said openings are filled with silicon dioxide by subjecting said body to an oxidation ambient and an elevated temperature to thermally oxidize the silicon surfaces in said openings.

10. The method of claim 6 and further comprising depositing a passivating layer over entire surface of said random access memory.

11. The method of claim 6 wherein the new areas of monocrystalline silicon resulting from the said bisection of said regions of monocrystalline silicon are substantially equal in size.

12. The method of claim 6 wherein said N+ layer on said P substrate is formed by epitaxial growth, said P layer is formed by epitaxial growth and said N+ layer on said P layer is formed by N+ outdiffusion from said N+ polycrystalline layer into a portion of the thickness of said P layer.

* * * * *